United States Patent
Liu et al.

(10) Patent No.: US 9,941,198 B2
(45) Date of Patent: Apr. 10, 2018

(54) METHOD OF MANUFACTURING A FLEXIBLE SUBSTRATE WITH CARBON NANOTUBE VIAS AND CORRESPONDING FLEXIBLE SUBSTRATE

(71) Applicant: SHT Smart High-Tech AB, Göteborg (SE)

(72) Inventors: Johan Liu, Västra Frölunda (SE); Di Jiang, Västra Frölunda (SE)

(73) Assignee: SHT SMART HIGH-TECH AB, Göteborg (SE)

( * ) Notice: Subject to any disclaimer, the term of this patent is extended or adjusted under 35 U.S.C. 154(b) by 0 days.

(21) Appl. No.: 15/306,096

(22) PCT Filed: Apr. 24, 2014

(86) PCT No.: PCT/EP2014/058349
§ 371 (c)(1),
(2) Date: Oct. 23, 2016

(87) PCT Pub. No.: WO2015/161879
PCT Pub. Date: Oct. 29, 2015

(65) Prior Publication Data
US 2017/0040250 A1 Feb. 9, 2017

(51) Int. Cl.
*H01L 23/498* (2006.01)
*H01L 21/48* (2006.01)
*H01L 23/538* (2006.01)

(52) U.S. Cl.
CPC ...... *H01L 23/49877* (2013.01); *H01L 21/486* (2013.01); *H01L 23/4985* (2013.01);
(Continued)

(58) Field of Classification Search
CPC ............ H01L 23/49877; H01L 21/486; H01L 23/49827; H01L 23/49838; H01L 23/4985; H01L 23/5389
(Continued)

(56) References Cited

U.S. PATENT DOCUMENTS 7,867,620 B1 * 1/2011 Yao ................ B82Y 30/00
428/408
2006/0081989 A1 4/2006 Uang
(Continued)

FOREIGN PATENT DOCUMENTS

EP 2061077 5/2009

OTHER PUBLICATIONS

Guido Ploner, International Search Report, parent PCT Application No. PCT/EP2014/058349, dated Dec. 15, 2014, European Patent Office, Rijswijk, NL.

*Primary Examiner* — Timothy Thompson
*Assistant Examiner* — Charles Pizzuto
(74) *Attorney, Agent, or Firm* — Babcock IP, PLLC

(57) ABSTRACT

There is provided a method for manufacturing a flexible film comprising carbon nanotube interconnects, the method comprising: providing a first substrate; forming and patterning a catalyst layer on the substrate; forming vertically aligned electrically conducting carbon nanotube bundles from the catalyst; providing a second substrate opposite the first substrate and in contact with the carbon nanotube bundles such that a gap is formed between the first and second substrates; providing a flowing curable polymer in the gap between the first substrate and the second substrate such that the gap is filled by the polymer; curing the polymer to form a flexible solid; and removing the first substrate and the
(Continued)

second substrate to provide a flexible polymer film comprising carbon nanotube interconnects connectable on respective sides of the film.

14 Claims, 5 Drawing Sheets

(52) U.S. Cl.
CPC .. *H01L 23/49827* (2013.01); *H01L 23/49838* (2013.01); *H01L 23/5389* (2013.01); *H01L 2924/0002* (2013.01)

(58) Field of Classification Search
USPC ........................................................ 361/751
See application file for complete search history.

(56) References Cited

U.S. PATENT DOCUMENTS

| | | | | |
|---|---|---|---|---|
| 2007/0004081 A1* | 1/2007 | Hsiao | ..................... | B82Y 10/00 438/106 |
| 2009/0032290 A1* | 2/2009 | Yeh | ........................ | B82Y 10/00 174/254 |
| 2010/0051331 A1* | 3/2010 | Tsai | ........................ | B82Y 10/00 174/256 |
| 2010/0051332 A1* | 3/2010 | Tsai | ........................ | B82Y 10/00 174/256 |
| 2013/0280515 A1* | 10/2013 | Daraio | ..................... | B32B 3/10 428/293.1 |
| 2014/0165265 A1* | 6/2014 | Tulin | ........................ | A41D 1/06 2/234 |
| 2014/0313636 A1* | 10/2014 | Tour | .................... | C01B 31/0438 361/502 |
| 2015/0138692 A1* | 5/2015 | Amaratunga | .......... | H01G 4/012 361/502 |
| 2015/0322232 A1* | 11/2015 | Hong | ........................ | C08L 7/00 524/574 |
| 2015/0349136 A1* | 12/2015 | Koo | ................... | H01L 29/78603 257/43 |
| 2016/0095212 A1* | 3/2016 | Lee | ................... | H01L 21/26506 174/251 |

* cited by examiner

METHOD OF MANUFACTURING A FLEXIBLE SUBSTRATE WITH CARBON NANOTUBE VIAS AND CORRESPONDING FLEXIBLE SUBSTRATE

FIELD OF THE INVENTION

The present invention relates to an electrical interconnect, and in particular to a method for manufacturing a carbon nanotube interconnect.

TECHNICAL BACKGROUND

Carbon nanotubes (CNTs) have been envisioned as one of the most promising engineering materials due to its excellent thermal, mechanical and electrical properties. The application of carbon nanotubes can be found in a variety of areas such as energy, MEMS and electronics. There are in principle three mature CNT fabrication technologies, arc discharge, laser ablation and chemical vapor deposition. Among all these three production methods, thermal chemical vapor deposition (CVD) has the advantage of flexible patterning and growing vertically aligned CNTs, which is enabled by photolithographically defining the growth catalyst metals.

The use and development of carbon nanotubes has expanded, as these materials have shown to be valuable in next generation industries including the fields of electronics and chemistry. Further development of carbon nanotube technology allows organized structures or intertwined randomly oriented bundles of carbon nanotubes to be formed. Techniques have been developed to controllably build organized architectures of nanotubes having predetermined orientations, such as vertically aligned nanotubes. Although such structures may be useful for a variety of purposes, the structures by themselves may be limited in terms of function and application.

In the area of flexible electronics for example, printed, sputtered or evaporated metal wires are the most common material used in making the electrical interconnects in the flexible electronics. However, traditional laser or etching technologies cannot be applied to flexible materials, such as PET, PEN or silicone based polymeric materials. This limitation greatly cripples the manufacturability to make vertical direct electrical interconnects in flexible substrates. Unlike metals, vertically aligned CNT bundles can be synthesized without any supporting or sacrificial layers. The CVD-grown CNTs are attached to the growing substrate by weak Van der Waals force and can therefore be easily manipulated by various methods such a coating, doping, densification or transfer. This merit makes the CNTs suitable for use in polymer based composite materials which require mechanical flexibility together with the electrical conductivity. Blending of CNTs into polymers has been extensively studied in recent years, and the application of such CNT-polymer composites can be found in a lot of areas such as biology, medicine, electronics and functional membranes/surface.

SUMMARY OF THE INVENTION

In view of the above-mentioned desired properties of interconnects for use in flexible electronics, it is an object of the present invention to provide an improved method for manufacturing a carbon nanotube interconnect in a flexible film.

According to a first aspect of the present invention, it is therefore provided a method for manufacturing a flexible film comprising carbon nanotube interconnects, the method comprising: providing a first substrate; forming and patterning a catalyst layer on the substrate; forming vertically aligned electrically conducting carbon nanotube bundles from the catalyst; providing a second substrate opposite the first substrate and in contact with the carbon nanotube bundles such that a gap is formed between the first and second substrates; providing a flowing curable polymer in the gap between the first substrate and the second substrate such that the gap is filled by the polymer; curing the polymer to form a flexible solid; and removing the first substrate and the second substrate to provide a flexible polymer film comprising carbon nanotube interconnects connectable on respective sides of the film.

A method for making flexible vertical carbon nanotube (CNT) interconnects is provided. The method is aimed at making flexible vertical carbon nanotube interconnects by embedding carbon nanotubes in flexible polymer based materials. In this invention, vertically aligned CNTs were embedded in polymer materials which are flexible after curing. The cured polymers forms a composite with the CNTs, and peeling the polymer film off the original CNT-carrying substrate will result in a mechanically flexible film with predefined vertical CNT interconnects penetrating through the film and forming an electrical conduction path from the bottom to the top the flexible film.

Through the present invention, carbon nanotube interconnects can be formed embedded in a flexible polymer film in an ordered manner. Thereby, it is possible to form flexible films, for use in flexible electronics, where the locations of interconnects can be precisely controlled.

In particular, due to the wetting of the flowing polymer on the substrate surface, the solution will flow into the gaps between the two substrates and in between the carbon nanotube bundles to completely fill the voids between the two substrates, to ensure that a homogenous flexible film can be formed by curing the polymer.

According to one embodiment of the invention, the step of forming the catalyst layer may advantageously comprise depositing an $AlO_2$ layer having a thickness of about 5 nm followed by depositing an Fe layer having a thickness of about 1 nm. From the catalyst layer, carbon nanotube bundles may be grown in a controlled manner.

Furthermore, the step of forming vertically aligned carbon nanotube bundles advantageously comprises growing said carbon nanotube bundles by chemical vapor deposition (CVD). CVD is an established fabrication method for growing carbon nanotubes, and the properties of the carbon nanotubes can be controlled by the parameters of the CVD process.

In one embodiment of the invention, the flowing polymer may be selected from the group comprising urethane, acrylics, silicones and epoxy resins. Several different types of polymers are able to provide the desired properties for the present application. In particular, several types of known polymers are flowing and can be cured to form a flexible film. In particular the flowing polymer may for example be a polydimethylsiloxane (PDMS)-based polymer.

In one embodiment of the invention, the step of curing may comprise heating the polymer. For a PDMS-based polymer, heating may for example be performed at 100° C. for 10 minutes, thereby solidifying the polymer to form a flexible film. However, the specific temperature and time depends both on the type of polymer used and on the thickness of the polymer layer, where a thicker layer takes longer to cure. In general, the maximum curing temperature for a PDMS-based polymer is 120° C. Moreover, the curing time is highly dependent on the curing temperature. Thus, curing at room temperature may take several hours while curing at an elevated temperature such as 100° C. may take about 10 min.

According to one embodiment of the invention, the flowing polymer may advantageously be configured to be transparent after curing. Thereby, a transparent flexible film is provided which for example may be used to form fully transparent flexible electronic circuits for applications where transparent electronics is desirable.

In one embodiment of the invention, the distance between the first substrate and the second substrate may advantageously correspond to the length of the grown carbon nanotube bundles. This means that the grown carbon nanotube bundles are sufficiently strong to carry the weight of the second substrate which is placed on top of the bundles, and that the bundles are not compressed or otherwise deformed by the second substrate. An alternative would be to use dedicated spacing structures between the substrates to define the distance between the first and second substrate, for example in applications where only few carbon nanotube interconnects are required.

According to one embodiment of the invention, the carbon nanotube bundles may advantageously be grown to a length of 100 μm to 500 μm. This will result in a flexible polymer film having the corresponding thickness, which provides mechanical stability while being sufficiently flexible.

In one embodiment of the invention, the polymer is advantageously able to withstand temperatures of at least 400° C. This will allow the cured polymer film to be used together with most common electronic components, which normally have a temperature limit at or below 400° C.

In one embodiment of the invention, the method may further comprise the step of coating the substrate with a metal layer, prior to the step of forming a catalyst layer.

Moreover, the method may further comprise the step of coating the substrate and the carbon nanotube bundles with a metal layer after the step of forming vertically aligned electrically conducting carbon nanotube bundles.

Polymers such as PDMS have been observed to exhibit a higher wettability, meaning that the polymer more easily makes contact, with a metal layer. Thereby, the wettability can be improved either by providing a metal layer on the substrate prior to growth of carbon nanotube bundles, or by providing a metal coating after CNT growth. Such a metal layer and/or coating can thus improve the wettability of both the polymer/silicon interface as well as of the polymer/CNT interface.

According to one embodiment of the invention, the method may further comprise the step of arranging an electrical component on the substrate, connected to at least one of the conducting carbon nanotube bundles via at least one horizontally aligned electrically conducting wire, such as a metal interconnect, prior to the step of providing the second substrate. Electrical components may advantageously be integrated in the fabrication process such that the final result of the method is a flexible polymer film with electrical components comprised therein which are electrically connectable via the carbon nanotube interconnects.

According to a second aspect of the invention, there is provided an electronic device comprising a first and a second flexible film comprising carbon nanotube interconnects manufactured according to the method described above, a first electronic component arranged within the first film, a second electronic component arranged within the second film, wherein the first film is arranged on top of and adjacent to the second film such that the first component is electrically connected to the second component via the carbon nanotube interconnects.

Effects and features of this second aspect of the present invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing an example embodiment of the invention, wherein.

DETAILED DESCRIPTION OF PREFERRED EMBODIMENTS OF THE INVENTION

In the present detailed description, various embodiments of a method for manufacturing a flexible film according to the present invention are mainly discussed with reference to a flexible film using a polydimethylsiloxane polymer. It should be noted that this by no means limits the scope of the present invention which is equally applicable to other types of polymers, such as urethane, acrylics and epoxy resins The fabrication method will be described with reference to FIGS. 1A-H, and with further reference to the flow chart of FIG. 2.

Figure 1A:
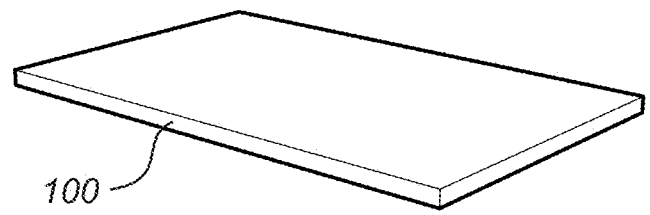
FIGS. 1A-H schematically illustrates a method for manufacturing a flexible film according to various embodiments of the invention.
Figure 2:
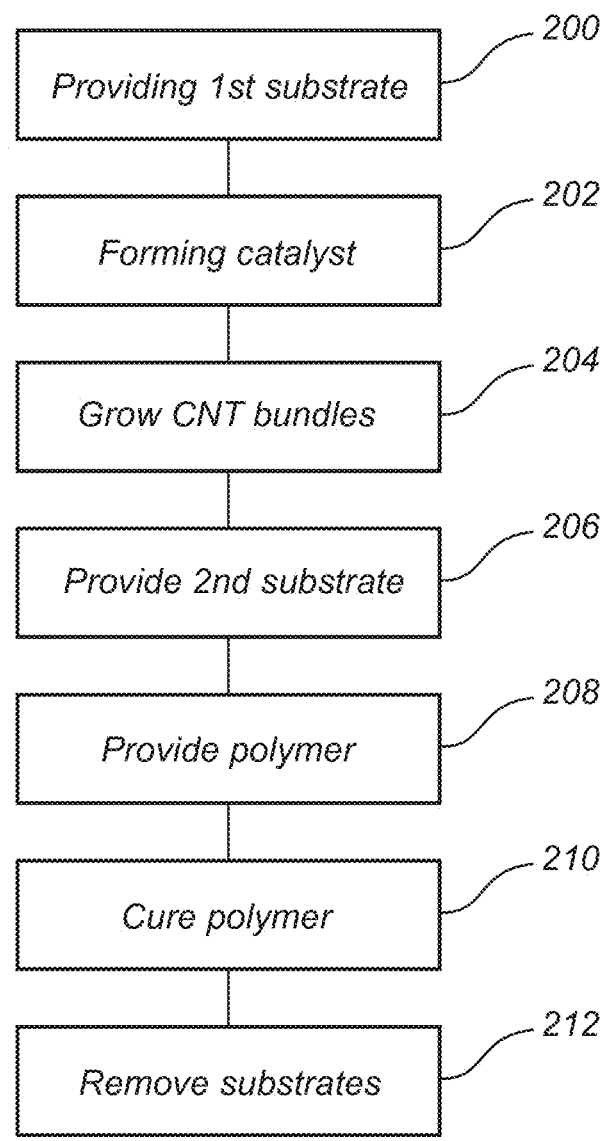
FIG. 2 is a flow chart outlining the general steps for manufacturing a flexible film according to various embodiments of the invention.

First 200, in FIG. 1A, a first silicon substrate 100 is provided. The substrate may in principle be of any known material, but a silicone substrate is typically used due to easy availability and low cost.

Next 202, a catalyst layer 102 is formed by depositing a 5 nm thick $Al_2O_3$ barrier layer followed by a 1 nm thick Fe catalyst layer, deposited by electron beam evaporation on the substrate 100. The thickness of the $Al_2O_3$ barrier layer can in principle be varied from 5 nm up to hundreds of nanometers. It is sufficient that the barrier layer is thick enough to prevent the Fe catalyst layer from diffusing into the underlying substrate. The thickness of the Fe catalyst layer can also be varied from about 0.5 nm up to 3 nm where different thickness of the Fe layers provides CNT bundles with different density. A 1 nm thick layer has been shown to provide the densest CNT bundles.

Figure 1B:
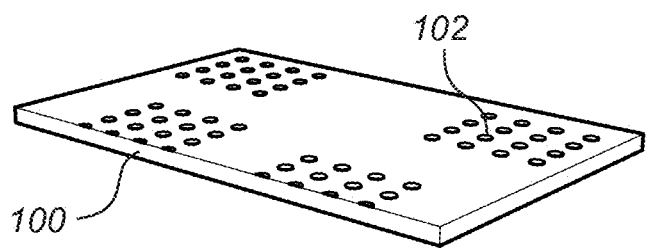

The catalyst layer 102 is patterned by standard positive or negative photolithography and the resulting patterned catalyst layer 102 which remains is illustrated in FIG. 1B.

Figure 1C:
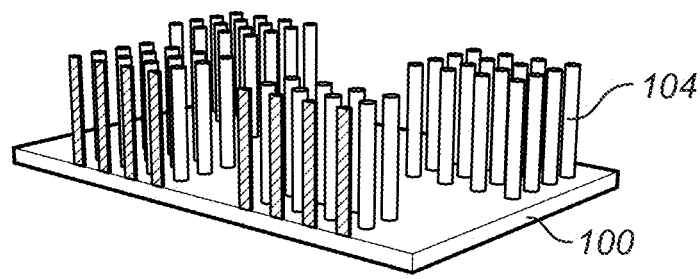
Figure 3:
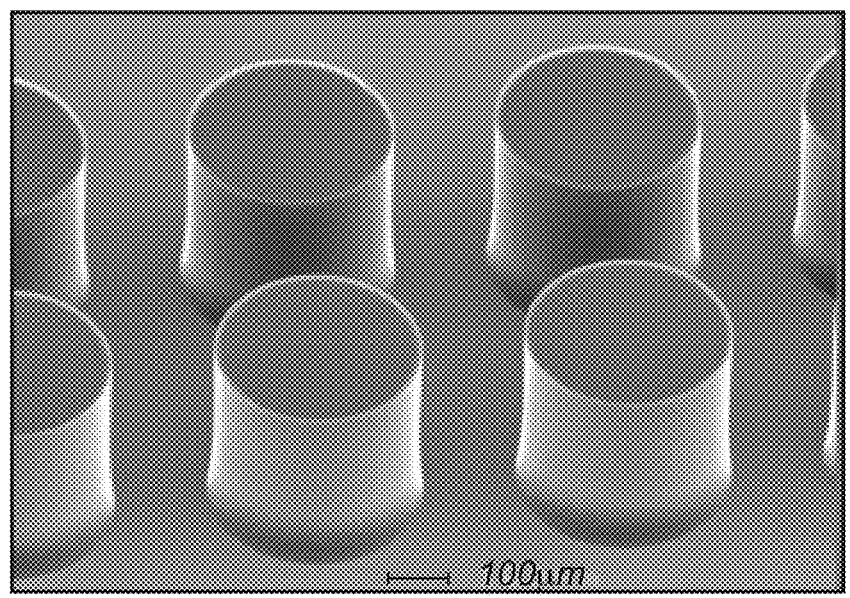
FIG. 3 is a scanning electron microscope image of grown carbon nanotube bundles.

In the following step 204, FIG. 1C, vertically aligned CNT bundles 104 are grown from the catalyst 102. The growth of CNT bundles is conducted in a commercially available CNT growth machine. The substrate 100 is first annealed at 500° C. for 3 minutes in a flow of about 700 standard cubic centimeters (sccm) $H_2$. The growth is then preformed in an additional flow of 200 sccm $C_2H_2$ at 700° C. for various growth time spans to achieve different desired CNT heights. After that, gas supplied are cut off and the reactor is cooled down to room temperature. FIG. 3 is a scanning electron microscope (SEM) picture of resulting CNT bundles. The length of the CNT bundles is proportional to the growth time, and the thickness of the resulting polymer film is thus controlled by controlling the growth time and thereby the length of the CNT bundles.

Figure 1D:
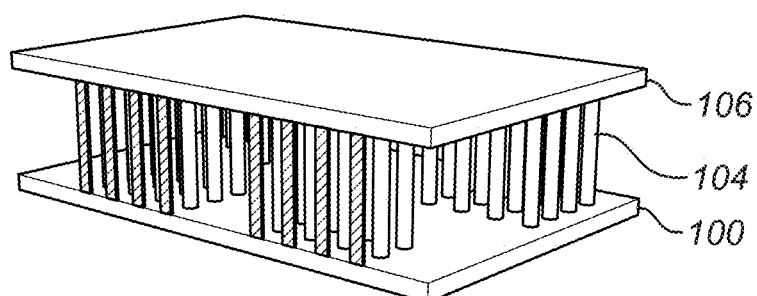

Following the growth of CNT bundles, a second substrate 106 is provided 206, preferably also made from silicon. The second substrate 106 is placed horizontally on top of the CNT bundles 104 of the first substrate 100 as shown in FIG. 1D. The strength of the CNT bundles 104 will support the weight of the second substrate 106, thereby preventing the bundles from falling down or otherwise deforming.

The preparation of a polymer solution is achieved by mixing ELASTOSIL® RT silicones 601A:601B at 9:1 ratio. This solution is de-bubbled at −60 kPa vacuum for 20 minutes before being applied. The preparation of a suitable polymer solution can also be achieved by varying the 601A:601B ratio between 12:1 to 8:1. A higher ratio results in a higher flexibility of the final film product. ELASTOSIL is a polydimethylsiloxane (PDMS) based silicone rubber. In this description, PDMS is used as an example for illustrating the process. It should however be noted that all similar equivalent curable polymer materials are applicable in the described method. The flowable polymer material should possess thermal-set properties, which means that the polymer should turn from liquid form into solid form when heated, thus generating the solid flexible films of interest.

Figure 1E:
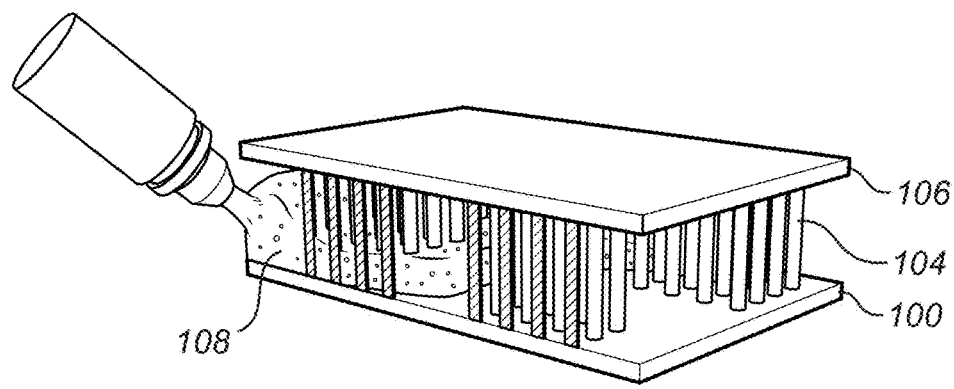
Figure 1F:
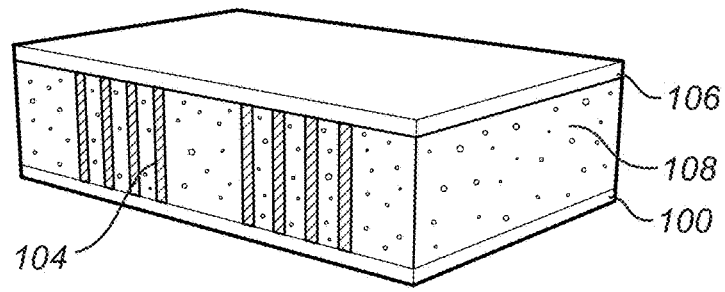

When the polymer solution 108 has been prepared, it is provided 208 at the edges of the substrate. This may for example be done manually using a suction pipe as illustrated in FIG. 1E, but any manual or automated means may be used for providing the polymer solution in the gap between the two substrates. Due to the wetting of the polydimethylsiloxane silicone on the silicon substrates 100 and 106, the solution will slowly flow into the gap between the two silicon substrates and fill the void in between as shown in FIG. 1F. After the space between the two silicon substrates is completely filled by the polydimethylsiloxane silicone solution, including gaps between adjacent CNT bundles, the polymer is cured 210 by heating the system up to about 100° C. and maintaining the temperature for 10 minutes. The heating process will cure and harden the polymer solution 108 and turn it from a viscous liquid into an elastic solid. The curing time is highly dependent on the curing temperature, where curing is faster at a higher temperature. The appropriate curing time may also be different for different polymers.

Figure 1G:
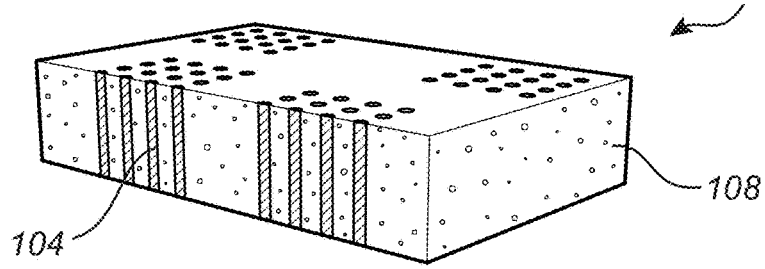
Figure 1H:
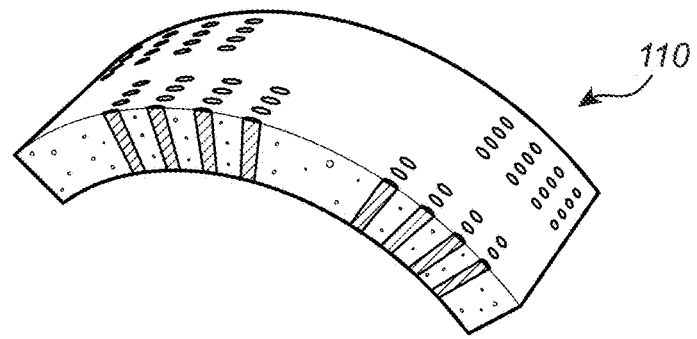

After the curing is completed, the system is cooled down to room temperature. The two silicon substrates are then separated 212 and removed, and the vertically aligned CNT bundles will be embedded in the resulting hardened (cured) flexible polydimethylsiloxane silicone film 110 as illustrated by FIG. 1G. The respective ends of the CNT bundles will be exposed, and not covered by polymer, such that they may readily be electrically connected and used as interconnects. A finished sample of the as-fabricated CNT-in-polydimethylsiloxane through plane electrical interconnecting mechanically flexible film 110 is schematically illustrated in FIG. 1H.

Accordingly, there is provided an embedding process which incorporates vertically aligned CNT bundles into a hardened polymer film material which provides through-film electrical conductivity and mechanical flexibility. The process could advantageously be used for making three dimensional electrical interconnects for flexible electronic systems conducting electricity in the vertical direction, enabling the possibility to fabricate three dimensional circuits in a flexible substrate system.

Figure 4A:
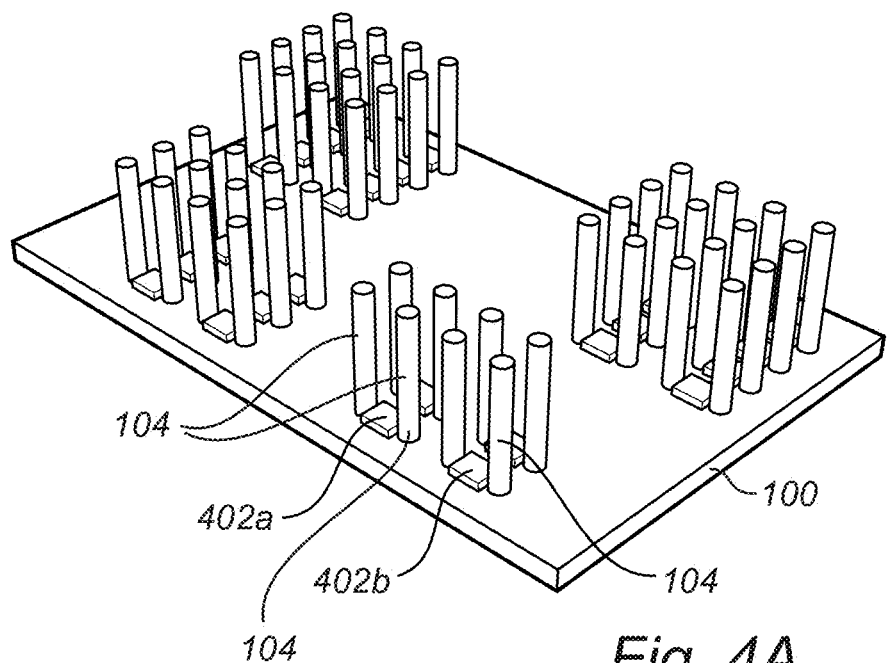
FIGS. 4A-B is an exemplary device according to an embodiment of the invention.

FIG. 4A schematically illustrate electric components 402a-b arranged on the substrate 100, and electrically connected to carbon nanotube interconnects 104. The step of providing such electric components is introduced between steps 204 and 206 discussed above. Electric components may be introduced as discrete components, or they may be grown and fabricated using known semiconductor-based manufacturing methods.

Figure 4B:
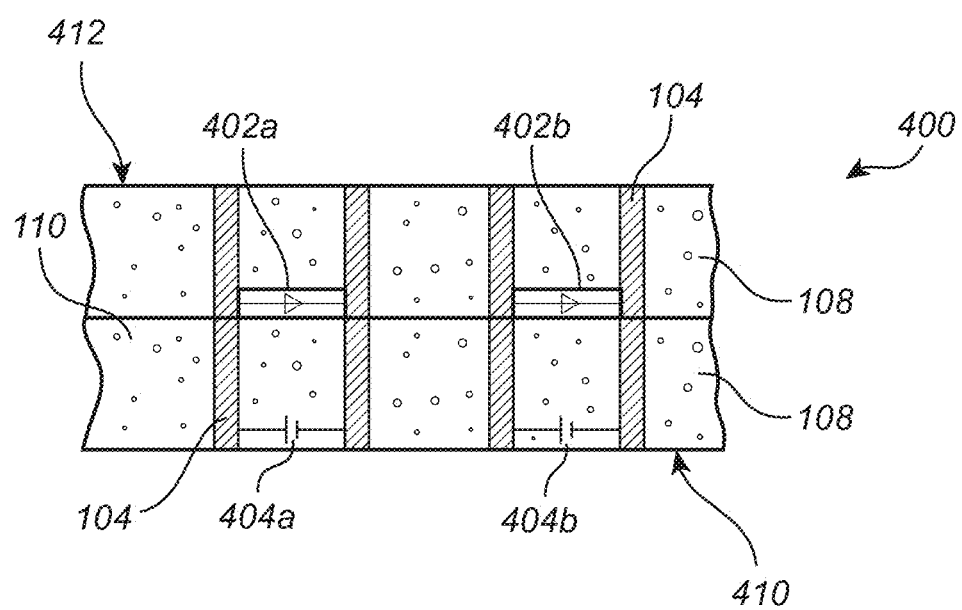

FIG. 4B is a schematic illustration of an electronic device 400 comprising a first flexible film 412 comprising carbon nanotube interconnects 104 manufactured as described above. A first set of electronic components 402a, 402b is arranged on a first side of said film, and a second set of electronic components 404a, 404b is arranged in a second film 410, and they are electrically connected to each other via the CNT interconnects of the films. In this way, flexible circuitry having two or more flexible layers can be provided.

Even though the invention has been described with reference to specific exemplifying embodiments thereof, many different alterations, modifications and the like will become apparent for those skilled in the art. For example, as discussed above, various polymers may be used to achieve the same end result.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method for manufacturing a flexible film comprising carbon nanotube interconnects, the method comprising:
   providing a first substrate;
   forming and patterning a catalyst layer on said substrate;
   forming vertically aligned electrically conducting carbon nanotube bundles from said catalyst;
   arranging an electrical component on said first substrate, connected to at least one of said conducting carbon nanotube bundles via at least one horizontally aligned electrically conducting wire;
   providing a second substrate opposite said first substrate and in contact with said carbon nanotube bundles such that a gap is formed between the first and second substrates;
   providing a flowing curable polymer in the gap between said first substrate and said second substrate such that the gap is filled by said polymer;
   curing the polymer to form a flexible solid; and
   removing said first substrate and said second substrate to provide a flexible polymer film comprising carbon nanotube interconnects connectable on respective sides of said film.

2. The method according to claim 1, wherein the step of forming said catalyst layer comprises depositing an $AlO_2$ layer having a thickness of about 5 nm followed by depositing an Fe layer having a thickness of about 1 nm.

3. The method according to claim 1, wherein the step of forming the vertically aligned carbon nanotube bundles comprises growing said carbon nanotube bundles by chemical vapor deposition (CVD).

4. The method according to claim 1, wherein the flowing polymer is selected from the group comprising urethane, acrylics, silicones and epoxy resins.

5. The method according to claim 1, wherein the flowing polymer is a polydimethylsiloxane-based polymer.

6. The method according to claim 1, wherein the step of curing comprises heating said polymer.

7. The method according to claim 6, wherein the step of curing comprises heating said polymer to 100° C. for 10 minutes.

8. The method according to claim 1, wherein the flowing polymer is configured to be transparent after curing.

9. The method according to claim 1, wherein a distance between the first substrate and the second substrate correspond to a length of the grown carbon nanotube bundles.

10. The method according to claim 1, wherein the carbon nanotube bundles are grown to a length of 100 μm to 500 μm.

11. The method according to claim 1, wherein said polymer is able to withstand temperatures of at least 400° C.

12. The method according to claim 1, further comprising the step of coating the first substrate with a metal layer, prior to the step of forming the catalyst layer.

13. The method according to claim 1, further comprising the step of coating the first substrate and said carbon nanotube bundles with a metal layer after the step of forming said vertically aligned electrically conducting carbon nanotube bundles.

14. An electronic device comprising:
a first and a second flexible film comprising carbon nanotube interconnects manufactured by a method comprising:
providing a first substrate;
forming and patterning a catalyst layer on said substrate;
forming vertically aligned electrically conducting carbon nanotube bundles from said catalyst;
providing a second substrate opposite said first substrate and in contact with said carbon nanotube bundles such that a gap is formed between the first and second substrates;
providing a flowing curable polymer in the gap between said first substrate and said second substrate such that the gap is filled by said polymer;
curing the polymer to form a flexible solid; and
removing said first substrate and said second substrate to provide a flexible polymer film comprising carbon nanotube interconnects connectable on respective sides of said film;
the electronic device further comprising:
a first electronic component arranged within said first flexible film; and
a second electronic component arranged within said second flexible film;
wherein said first flexible film is arranged on top of and adjacent to said second flexible film such that said first electrical component is electrically connected to said second electrical component via said carbon nanotube interconnects.

* * * * *